(12) United States Patent
Shimaya

(10) Patent No.: US 7,514,960 B2
(45) Date of Patent: Apr. 7, 2009

(54) LEVEL SHIFTER CIRCUIT

(75) Inventor: Hiroshi Shimaya, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 103 days.

(21) Appl. No.: 11/395,374

(22) Filed: Apr. 3, 2006

(65) Prior Publication Data

US 2006/0226875 A1 Oct. 12, 2006

(30) Foreign Application Priority Data

Apr. 6, 2005 (JP) .............................. 2005-110092

(51) Int. Cl.
*H03K 19/0175* (2006.01)
(52) U.S. Cl. ............................ 326/68; 326/81; 327/333
(58) Field of Classification Search .................. 326/68, 326/81, 83, 86; 327/65, 333
See application file for complete search history.

(56) References Cited

U.S. PATENT DOCUMENTS

| | | | | |
|---|---|---|---|---|
| 4,800,303 A | * | 1/1989 | Graham et al. ................. 326/72 |
| 5,568,062 A | * | 10/1996 | Kaplinsky ...................... 326/27 |
| 6,249,145 B1 | * | 6/2001 | Tanaka et al. ................... 326/68 |
| 6,617,878 B2 | * | 9/2003 | Brownlow et al. ............. 326/68 |
| 6,639,427 B2 | * | 10/2003 | Dray et al. ..................... 326/83 |
| 7,145,364 B2 | * | 12/2006 | Bhattacharya et al. ......... 326/68 |

FOREIGN PATENT DOCUMENTS

| | | |
|---|---|---|
| JP | 3-98314 | 4/1991 |
| JP | 7-193488 | 7/1995 |
| JP | 2003-143004 | 5/2003 |

* cited by examiner

*Primary Examiner*—Daniel D Chang
(74) *Attorney, Agent, or Firm*—McGinn IP Law Group, PLLC

(57) ABSTRACT

A level shifter circuit has first to fourth transistors and a resistive element. The first transistor is activated in response to a logic signal whose high level voltage is a first voltage. The second transistor is activated in response to the inverse logic signal. Each of the first and second transistors is connected between a power supply line for supplying a second voltage and a ground line. The third transistor is connected to a drain of the first transistor through a first node. The fourth transistor is connected to a drain of the second transistor through a second node. A gate of the third transistor is connected to the drain of the second transistor through the second node. A gate of the fourth transistor is connected to the drain of the first transistor through the first node. The resistive element is connected between the first node and the second node.

18 Claims, 18 Drawing Sheets

CHANGE IN POTENTIAL AT SIXTH NODE 18

——— LEVEL SHIFTER (CONVENTIONAL)
------ LEVEL SHIFTER (PRESENT INVENTION)

US 7,514,960 B2

LEVEL SHIFTER CIRCUIT

BACKGROUND OF THE INVENTION

1. Field of the Invention

The present invention relates to a level shifter circuit.

2. Description of the Related Art

When circuits operating with different power supply voltages are connected to each other, a level shifter circuit has been widely used and provided between the circuits. The level shifter circuit shifts the level of power supply voltage to ensure consistency. The level shifter circuit shifts up (or shifts down) the signal level of a former circuit so as to correspond to the signal level of a latter circuit side, and supplies the shifted-up (shifted-down) signal to the latter circuit.

For example, let us consider a case where a circuit operating with a low power supply voltage is connected to a circuit operating with a high power supply voltage. In this case, a level shifter circuit shifts up a signal from the low power supply voltage operating circuit side to a signal of the high power supply voltage level, and supplies the shifted-up signal to the high power supply voltage circuit side (See Japanese Laid-Open Patent Application JP-A-Heisei, 3-98314, for example).

FIG. 1 is a circuit diagram showing a configuration of a level shifter circuit described in Japanese Laid-Open Patent Application (JP-A-Heisei, 3-98314). In the level shifter circuit disclosed in the patent document, an active device for receiving a digital signal on the low-voltage side consists of a first MOS transistor 101 and a second MOS transistor 102. The digital signal and the inverted digital signal on the low-voltage side are input to respective gates of the first MOS transistor 101 and the second MOS transistor 102. A third MOS transistor 103 and a fourth MOS transistor 104 of the opposite conductive type are interposed between the high power supply line VDD and respective output sides of the first MOS transistor 101 and the second MOS transistor 102. Also, respective gates of the third MOS transistor 103 and the fourth MOS transistor 104 are connected to respective output sides of the second MOS transistor 102 and the first MOS transistor 101. A digital signal on the high-voltage side is taken from an output terminal 107 connected to the output side of the second MOS transistor 102. According to the level shifter circuit thus constructed, it is possible to supply the signal output from the low power supply voltage operating circuit to the high power supply voltage operating circuit.

For example, let us consider a case when an input signal to an input signal terminal 105 changes from High level to Low level, and an input signal to the, other input signal terminal 106 changes from Low level to High level. In this case, the N-channel MOS transistor 102 is turned on, and then the P-channel MOS transistor 103 is turned on. Thus, two steps are necessary for the change in the voltage level at a node 111 from Low level to High level according to the above-mentioned conventional configuration. On the other hand, let us consider a case when an input signal to the input signal terminal 105 changes from Low level to High level, and an input signal to the other input signal terminal 106 changes from High level to Low level. Similar to the foregoing case, two steps are necessary for the change in the voltage level at a node 112 from Low level to High level. As described above, a high-speed operation is difficult according to the conventional level shifter shown in FIG. 1.

Techniques to accelerate an operation of a level shifter circuit are known. A level shifter circuit described in Japanese Laid-Open Patent Application (JP-A-Heisei, 7-193488) has a first N-channel MOS transistor and a second N-channel MOS transistor. A drain of the first N-channel MOS transistor is connected to a high voltage power supply. A gate of the first N-channel MOS transistor is connected to an output of an inverter operating with a low power supply voltage. A source of the first N-channel MOS transistor is connected to a drain of a first P-channel MOS transistor of two P-channel MOS transistors, a gate of a second P-channel MOS transistor, and a drain of the second N-channel MOS transistor. A source of the second N-channel MOS transistor is connected to a gate of the first P-channel MOS transistor, a drain of the second P-channel MOS transistor and a drain of the first N-channel MOS transistor.

The Japanese Laid Open Patent Application (JP-P2003-143004A) describes a technique capable of realizing reduction in static power supply current and operation time while restricting an increase of the circuit area in a chip. According to the technique described in the patent document, when a low power supply voltage operation circuit and a high power supply voltage operation circuit as circuits operating with different power supply voltages are connected to each other, provided between the power supply voltage operation circuits is a first N-channel MOS transistor which is turned of/off in sync with level change of a signal from one power supply voltage operation circuit. Furthermore, a second N-channel MOS transistor which is turned on/off in inverse to the level change of the signal from the one power supply voltage operation circuit side, a first P-channel MOS transistor which is turned on/off in sync with the second N-channel MOS transistor and a second P-channel MOS transistor which is turned on/off in sync with the first N-channel MOS transistor are serially connected from power supply voltage of the other power supply voltage operation circuit side to a ground potential through the first P-channel MOS transistor and the first N-channel MOS transistor.

Simultaneously, they are serially connected from power supply voltage of the other power supply voltage operation circuit side to the ground potential through the second P-channel MOS transistor and the second N-channel MOS transistor. A signal from a first connection point between the first P-channel MOS transistor and the first N-channel MOS transistor or a second connection point between the second P-channel MOS transistor and the second N-channel MOS transistor is transmitted to the other power supply voltage operation circuit side through a buffer operating with the power supply voltage of the other power supply voltage operation circuit. Thus, between the power supply voltage operation circuits, the voltage level of the signal from the one power supply voltage operation circuit side is shifted to match with the voltage level of the signal from the other power supply voltage operation circuit side. In the level shifter circuit, provided are a first diode which is connected to a substrate terminal of the first N-channel MOS transistor at an anode thereof and connected to the second connection point at a cathode thereof, and a second diode which is connected to a substrate terminal of the second N-channel MOS transistor at an anode thereof and connected to the first connection point at a cathode thereof.

SUMMARY OF THE INVENTION

There are problems with the above-mentioned conventional level shifters in the following points. In the level shifter shown in FIG. 1, as described above, a plurality of steps are necessary for the change from Low level to High level, and thus high-speed operation may be difficult. In addition, the power supply voltage on the low voltage side has been lowered in order to address miniaturization and power reduction of semiconductor devices with recent advance in semiconductor technology. In a case when an input signal of power supply voltage lower than the power supply voltage conventionally used on the low voltage side is supplied, it may be difficult to properly operate the level shifter circuits described in the Japanese Laid-Open Patent Application (JP-A-Heisei, 7-193488) and Japanese Laid Open Patent Application (JP-P2003-143004A).

In an aspect of the present invention, a level shifter circuit has a first transistor, a second transistor, a third transistor, a fourth transistor, and a resistive element. The first transistor is activated in response to a logic signal whose high level voltage is a first voltage. The second transistor is activated in response to an inverse logic signal whose logic is opposite to that of the logic signal. The third transistor is connected to a drain of the first transistor through a first node. The fourth transistor is connected to a drain of the second transistor through a second node. The resistive element is connected between the first node and the second node.

In the level shifter, the first transistor is connected between a power supply line and a ground line, the power supply line supplying a second voltage different from the first voltage. The second transistor is connected between the power supply line and the ground line. A gate of the third transistor is connected to the drain of the second transistor through the second node. A gate of the fourth transistor is connected to the drain of the first transistor through the first node.

In the level shifter thus constructed, the resistive element is configured by a MOS transistor or a passive resistive element, for example. The resistive element provides a current path in response to a potential difference between the first node and the second node. That is, the first node and the second node are electrically connected with each other through the resistive element. As a result, the current path is formed from the second voltage power supply line to the ground line through the resistive element, when an input signal (the logic signal and the inverse logic signal) is input to the level shifter.

According to the present invention, it is possible to form a level shifter circuit with a higher operating speed than that of the conventional level shifter circuits. Furthermore, when the voltage (second power supply voltage V2 in an embodiment) of the high voltage side power supply is constant and even if the voltage (first power supply voltage V1 in the embodiment) of the low voltage side power supply is lower than that of the conventional level shifter circuit, the level shifter circuit according to the present invention can operate properly.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 2:
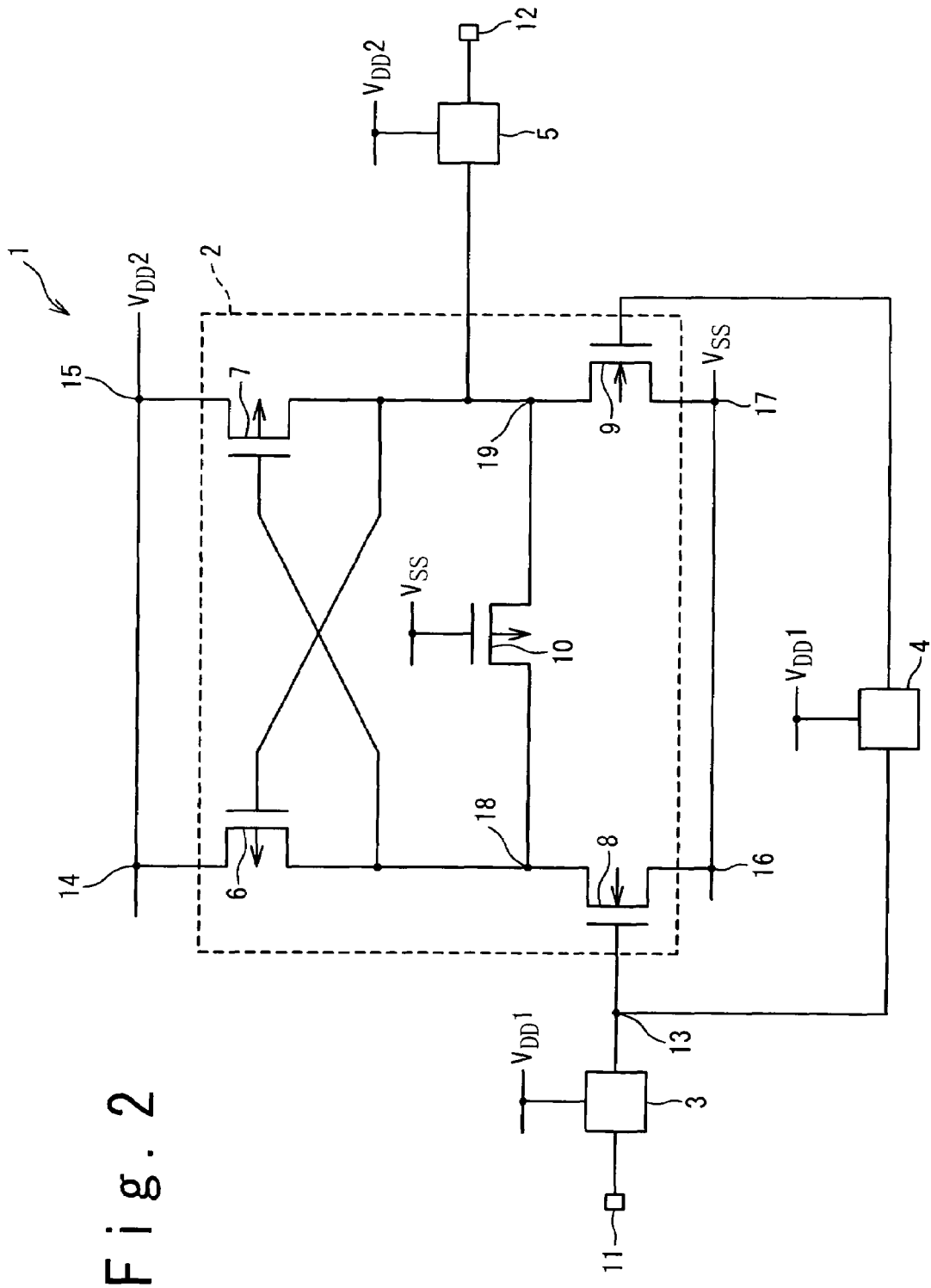
FIG. 2 is a circuit diagram showing a configuration of a level shifter circuit according to a first embodiment of the present invention.

FIG. 2 is a circuit diagram showing a configuration of a level shifter circuit 1 according to a first embodiment. In the present embodiment, a first power supply voltage V1 is supplied from a first power supply line $V_{DD}1$, and a second power supply voltage V2 is supplied from a second power supply line $V_{DD}2$. Here, the first power supply voltage V1 is smaller than the second power supply voltage V2.

Referring to FIG. 2, the level shifter circuit 1 according to the present embodiment includes a level shifter part 2, a first logic circuit 3, a second logic circuit 4 and a first output logic circuit 5. The first logic circuit 3 is a logic circuit for generating a first input signal in response to a basic input signal supplied through an input terminal 11. The first input signal output from the first logic circuit 3 is supplied to a first NMOS transistor 8 of the level shifter part 2 via a first node 13. The first input signal is also input to the second logic circuit 4 via the first node 13. The second logic circuit 4 is a logic circuit for generating a second input signal in response to the first input signal. The second input signal output from the second logic circuit 4 is input to a second NMOS transistor 9 of the level shifter part 2. As shown in FIG. 2, the first logic circuit 3 and the second logic circuit 4 are connected to the first power supply line $V_{DD}1$. The first logic circuit 3 generates the first input signal on the basis of the first power supply voltage V1 supplied from the first power supply line $V_{DD}1$. Similarly, the second logic circuit 4 generates the second input signal on the basis of the first power supply voltage V1.

The first output logic circuit 5 shown in FIG. 2 is an output stage circuit operating in response to an output signal supplied from the level shifter part 2. As shown in FIG. 2, the first output logic circuit 5 is connected to the second power supply line $V_{DD}2$ and an output terminal 12. The first output logic circuit 5 generates an output signal on the basis of the second power supply voltage V2, and outputs the generated output signal to the output terminal 12.

The level shifter part 2 includes a first P-channel MOS (hereinafter referred to as PMOS) transistor 6, a second PMOS transistor 7, a first N-channel MOS (hereinafter referred to as NMOS) transistor 8, a second NMOS transistor 9 and a resistive element 10. As shown in FIG. 2, the first PMOS transistor 6 is connected to the second power supply line $V_{DD}2$ via a second node 14, and the second PMOS transistor 7 is connected to the second power supply line $V_{DD}2$ via a third node 15. The first NMOS transistor 8 is connected to a ground line $V_{SS}$ via a fourth node 16, and the second NMOS transistor 9 is connected to the ground line $V_{SS}$ via a fifth node 17.

The first PMOS transistor 6 and the first NMOS transistor 8 are connected to each other via a sixth node 18, and the second PMOS transistor 7 and the second NMOS transistor 9 are connected to each other via a seventh node 19. A gate of the first PMOS transistor 6 is connected to a drain of the second PMOS transistor 7, and a gate of the second PMOS transistor 7 is connected to a drain of the first PMOS transistor 6.

Referring to FIG. 2, the resistive element 10 is connected between the sixth node 18 and the seventh node 19. In the following description of the present embodiment referring to FIG. 2, the case where the resistive element 10 is a PMOS transistor is used as an example. As shown in FIG. 2, a gate of the resistive element 10 in the present embodiment is connected to the ground line $V_{SS}$. During the operation of the level shifter circuit 1, a ground potential supplied from the ground line $V_{SS}$ is applied to the gate of the resistive element 10. Accordingly, the resistive element 10 is steadily activated and operates in an ON state, when the level shifter circuit 1 performs a normal operation.

Figure 3:
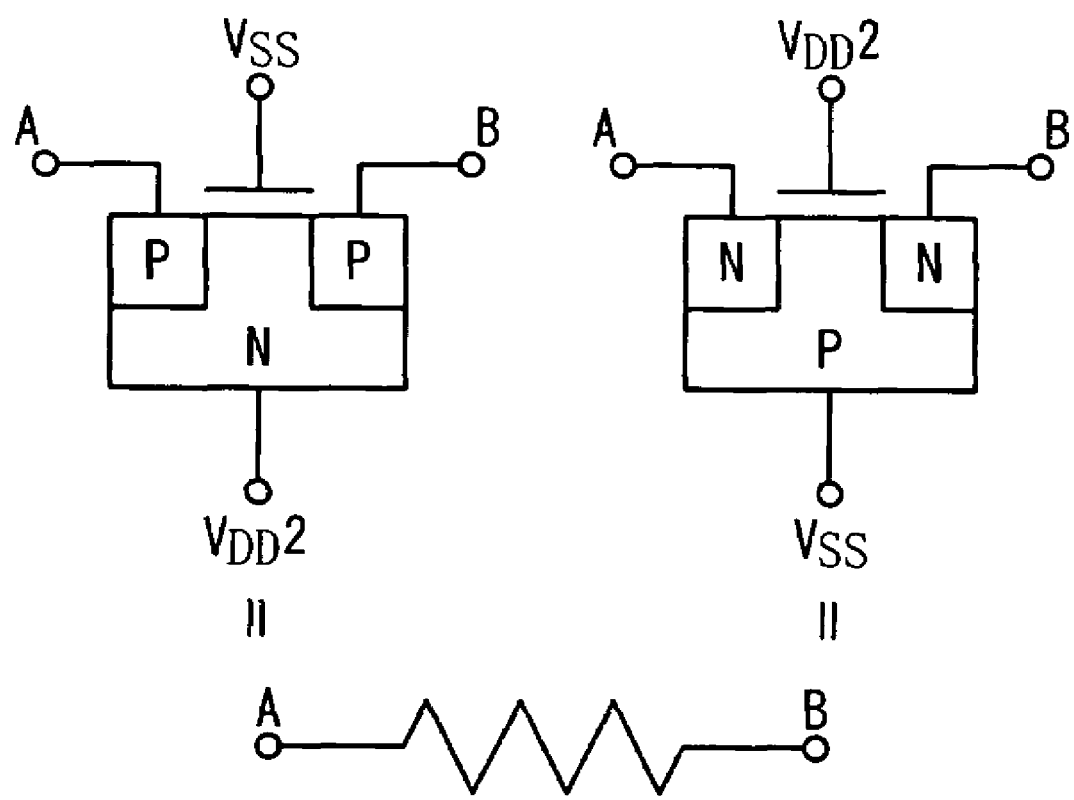
FIG. 3 is a conceptual diagram showing an operation of a MOS transistor.

FIG. 3 is a view showing an operation of the resistive element 10 in the present embodiment. As shown in FIG. 3, when the PMOS transistor (or a NMOS transistor) is activated (in the ON state), electrical resistance called an "ON resistance" exists between a drain electrode and a source electrode of the PMOS transistor (or the NMOS transistor). The MOS transistor provided in the level shifter circuit 1 of the present embodiment plays a role of a resistive element due to its ON resistance.

Figure 4:
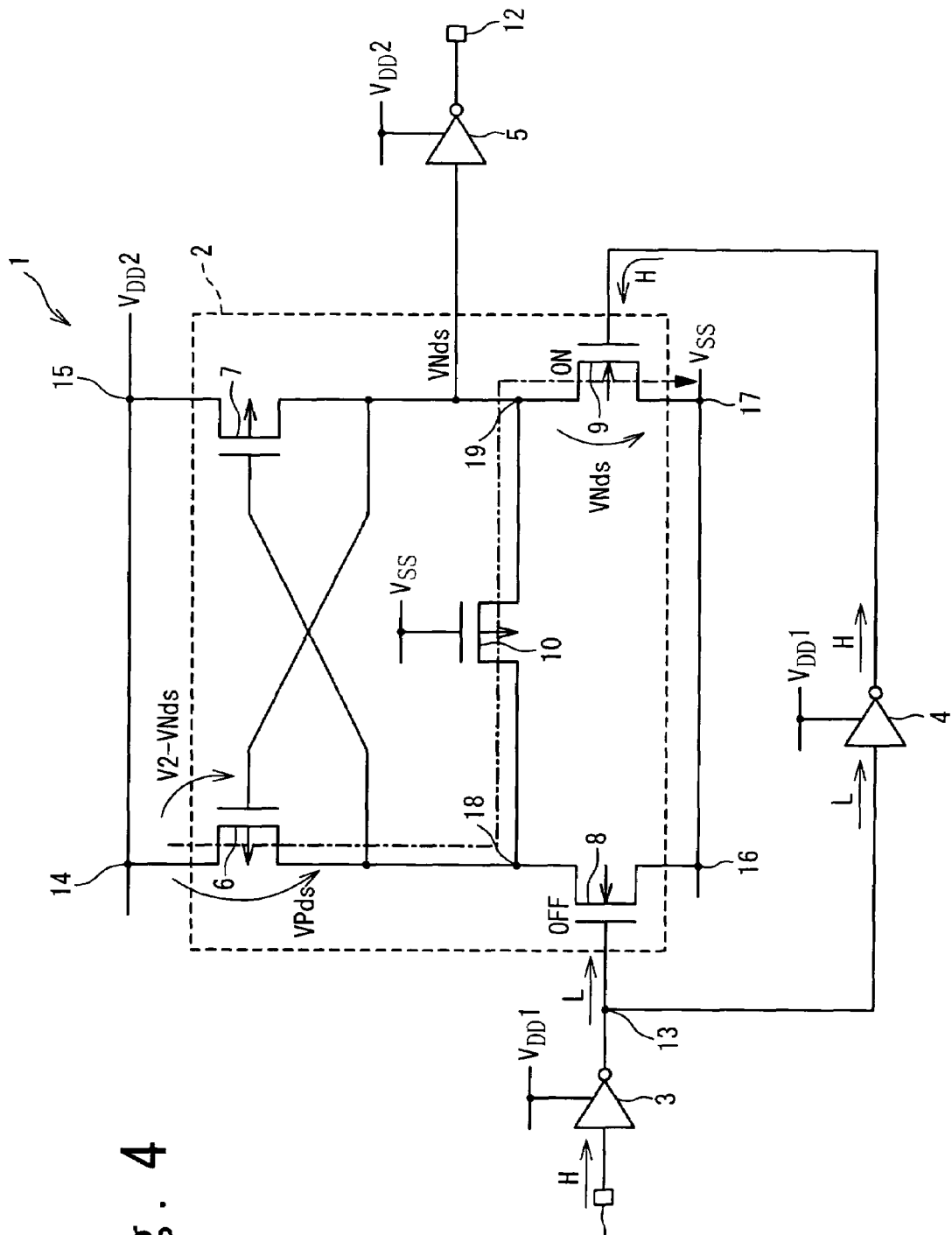
FIG. 4 is a view showing an operation of the level shifter circuit according to the first embodiment.
Figure 5:
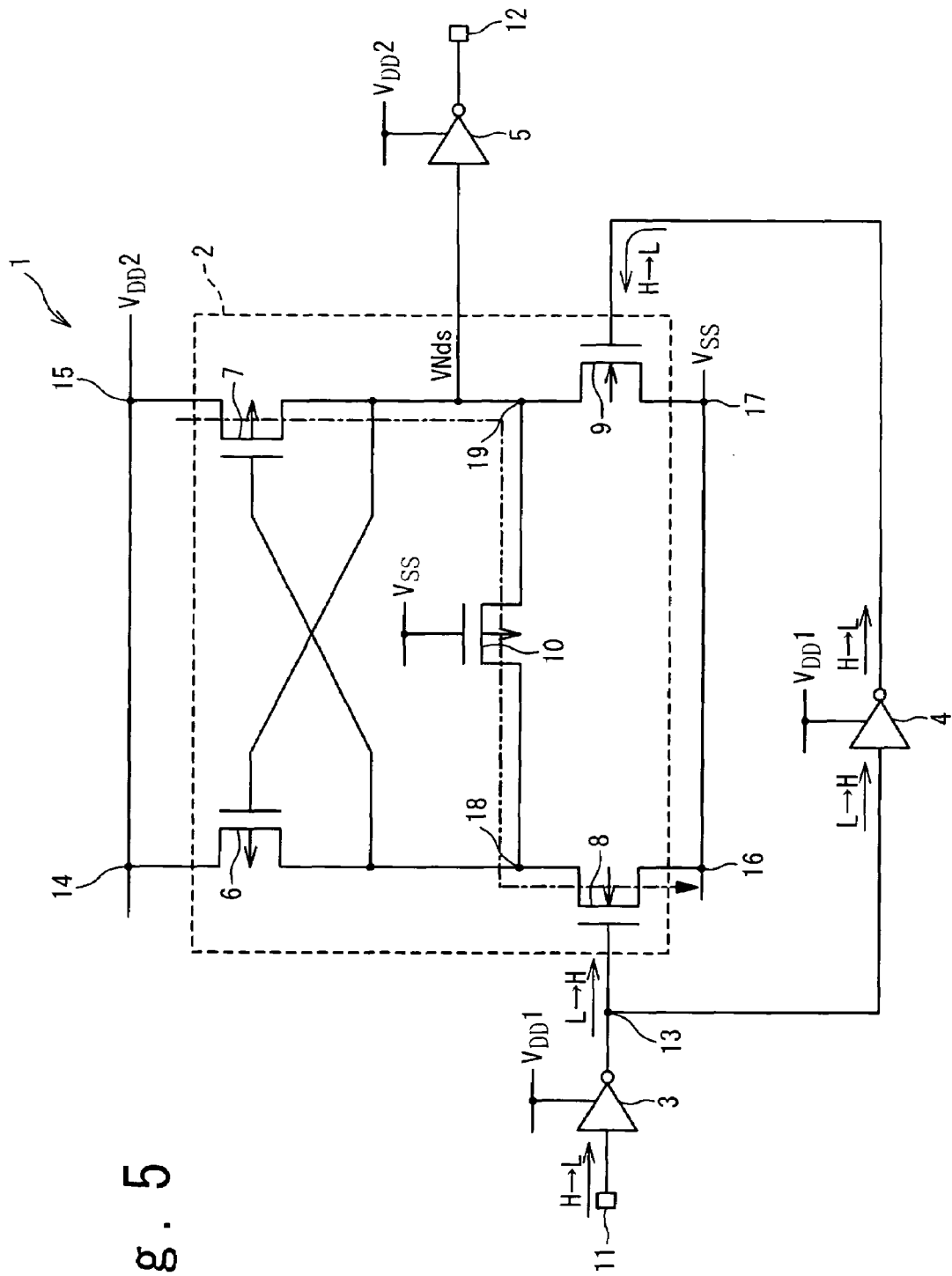
FIG. 5 is a view showing an operation of the level shifter circuit according to the first embodiment.

Next, an operation of the level shifter circuit 1 according to the present embodiment when the basic input signal of High level or Low level is supplied to the input terminal 11 will be described. In the following description of the operation, a case where the first logic circuit 3, the second logic circuit 4 and the first output logic circuit 5 are inverters will be explained as an example. FIG. 4 is a circuit diagram showing a configuration of the level shifter circuit 1 in the case where the first logic circuit 3, the second logic circuit 4 and the first output logic circuit 5 are inverters as described above. FIG. 5 is a circuit diagram showing an operation of the level shifter circuit 1 in the case where the basic input signal supplied through the input terminal 11 is inverted.

As shown in FIG. 4, when a signal of High level (an input signal whose voltage is the first power supply voltage V1) is supplied to the first logic circuit 3, a signal of Low level is output from the first logic circuit 3. The signal of Low level is supplied to the gate of the first MNOS transistor 8 and the second logic circuit 4. In response to the signal of Low level, the second logic circuit 4 generates a signal of High level and supplies the generated signal to the second NMOS transistor 9. As a result, the first NMOS transistor 8 is turned off, and the second NMOS transistor 9 is turned on. The first PMOS transistor 6 is turned on, and the second PMOS transistor 7 is turned off. At this time, since the resistive element 10 (the MOS transistor in the ON state) is provided in the level shifter circuit 1 according to the present embodiment, a current path is formed as follows: the second power supply line $V_{DD}2$—the first PMOS transistor 6—the sixth node 18—the resistive element 10—the seventh node 19—the second NMOS transistor 9—the ground line $V_{SS}$ (indicated by a chain line in FIG. 4). That is, a current flows from the second power supply line $V_{DD}2$ to the ground line $V_{SS}$ through the first PMOS transistor 6, the sixth node 18, the resistive element 10, the seventh node 19, the second NMOS transistor 9. When the current flows through the first PMOS transistor 6 and the second NMOS transistor 9, a voltage drop occurs in these transistors.

Here, a source-drain voltage of the second NMOS transistor 9 (or the first NMOS transistor 8) is an N-channel drain-source voltage VNds, and a source-drain voltage of the first PMOS transistor 6 (or the second PMOS transistor 7) is a P-channel drain-source voltage VPds. In this case, the potentials at the sixth node 18 and the seventh node 19 are given as follows: "Potential at the sixth node 18"="Second power supply voltage V2"–"P-channel drain-source voltage VPds"; and "Potential at the seventh node 19"="N-channel drain-source voltage VNds".

Figure 1:
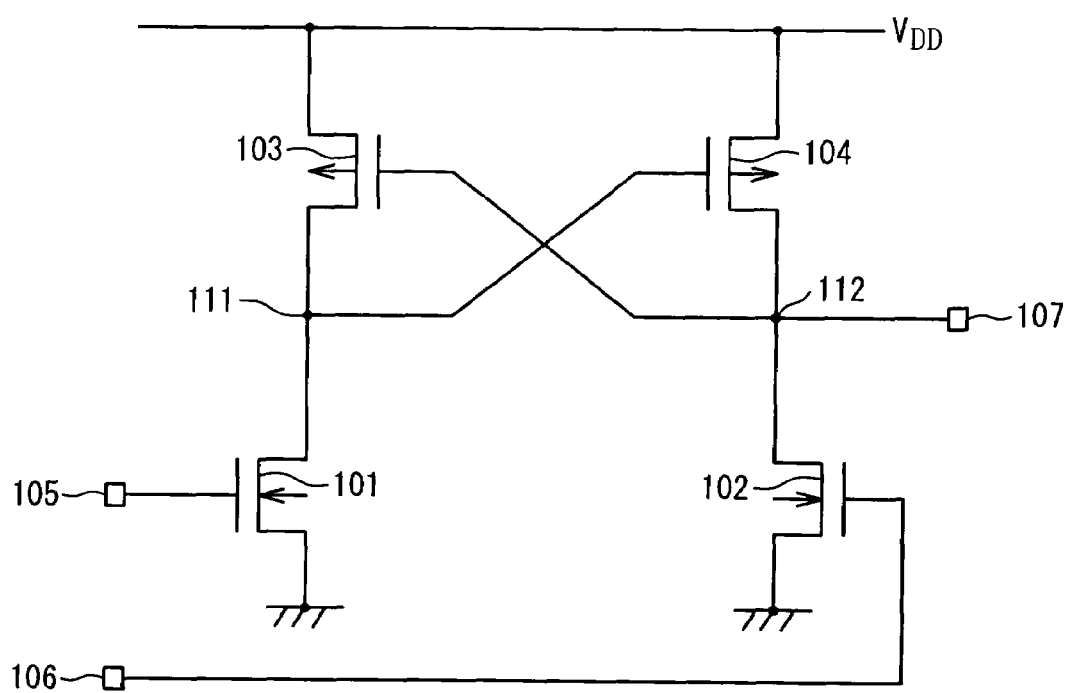
FIG. 1 is a circuit diagram showing a configuration of a conventional level shifter circuit.

Also, a gate-source voltage of the first PMOS transistor 6 at this time is a P-channel gate-source voltage Vgs, which is given as follows: "P-channel gate-source voltage Vgs"="Second power supply voltage V2"–"N-channel drain-source voltage VNds". As described above, due to the voltage drop, a current drive capability of the PMOS transistor according to the present embodiment becomes smaller than that of the PMOS transistor in the conventional level shifter circuit (for example, the PMOS transistor 103 in FIG. 1). On the other hand, a gate-source voltage Vgs (referred to as an N-channel gate-source voltage Vgs) of the NMOS transistor (the first NMOS transistor 8 or the second NMOS transistor 9) in the level shifter circuit 1 according to the present embodiment is equal to the conventional one. Thus, a current drive capability of the NMOS transistor is the same as the conventional technique.

Next, an operation in a case when the input signal supplied through the input terminal 11 changes from High level to Low level (the input voltage is the ground potential) will be described. FIG. 5 is a diagram showing the operation of the level shifter circuit 1 in the case where the basic input signal changes from High level to Low level. As shown in FIG. 5, when the input signal changes, the first NMOS transistor 8 is turned on, and the second NMOS transistor 9 is turned off. At this time, a situation occurs where both the first PMOS transistor 6 and the first NMOS transistor 8 are in the ON state simultaneously. However, since the current drive capability of the first PMOS transistor 6 is smaller than that of the conventional technique and the current drive capability of the first NMOS transistor 8 is equal to that of the conventional technique, the potential at the sixth node 18 begins to decrease earlier as compared with the conventional level shifter circuit. Furthermore, since a range of the voltage change at the sixth node 18 is narrower than that of the conventional technique, an operating speed is increased as compared with the conventional level shifter circuit.

As shown in FIG. 5, a current path is formed as follows: the second power supply line $V_{DD}2$—the second PMOS transistor 7—the seventh node 19—the resistive element 10—the sixth node 18—the first NMOS transistor 8—the ground line $V_{SS}$ (indicated by a chain line in FIG. 5). That is, a current flows from the second power supply line $V_{DD}2$ to the ground line $V_{SS}$ through the second PMOS transistor 7, the seventh node 19, the resistive element 10, the sixth node 18, the first NMOS transistor 8. In this case, the potentials at the sixth node 18 and the seventh node 19 are given as follows: "Potential at the sixth node 18"="N-channel drain-source voltage VNds"; and "Potential at the seventh node 19"="Second power supply voltage V2"–"P-channel drain-source voltage VPds". A similar operation is performed also when the basic input signal changes from Low level to High level.

It is thus possible to enhance the operating speed of the level shifter circuit 1 as compared with the conventional one. With miniaturization and lower power consumption of the circuit, it has been demanded to lower the potential of the low voltage side power supply. When the potential of the low voltage side power supply is lowered too much, the input voltage (gate-source voltage) Vgs input to the first NMOS transistor 8 and the second NMOS transistor 9 in the level shifter becomes smaller, resulting in decrease in the current drive capability of the NMOS transistors. For this reason, there is a possibility that the potential at the drain of the NMOS transistor cannot be lowered to a threshold potential of the first output logic circuit 5.

However, according to the level shifter circuit 1 in the present embodiment, the current drive capability of the PMOS transistor is smaller than that of the conventional one. Therefore, the level shifter circuit 1 can operate even when the current drive capability of the NMOS transistor constituting the level shifter circuit 1 becomes smaller. Accordingly, even when the input voltage (gate-source voltage) Vgs input to the first NMOS transistor 8 and the second NMOS transistor 9 is small, the level shifter circuit 1 is capable of operating. Therefore, when the voltage of the high voltage side power supply (the second power supply voltage V2) is constant, it is possible by using the level shifter circuit 1 according to the present embodiment to set the voltage of the low voltage side power supply (the first power supply voltage V1) lower. In other words, it is possible to design the input side circuit to operate with the lower operation voltage.

Figure 6:
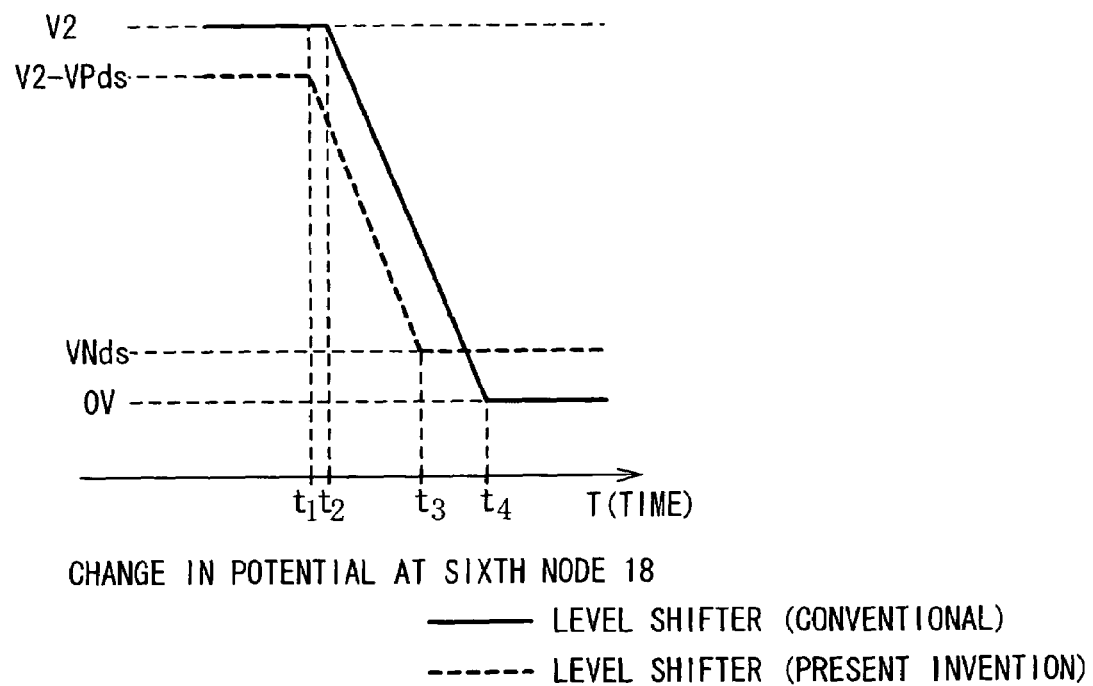
FIG. 6 is a waveform chart showing a change in potential at a node connected to a resistive element.

FIG. 6 is a waveform chart showing the potential change at the sixth node 18 in the level shifter circuit 1 according to the present embodiment. A dashed line in FIG. 6 represents the time variation of the potential at the sixth node 18 according to the present embodiment. Also shown in FIG. 6 is the corresponding time variation according to the conventional technique (time variation of the potential at the node 111 in FIG. 1), which is indicated by a solid line.

Referring to FIG. 6, the potential at the sixth node 18 begins to decrease at the time t1 which is earlier than the time t2, as described above. That is to say, according to the present embodiment, the potential at the output node in the level shifter circuit 1 begins to decrease earlier than that in the conventional level shifter. Furthermore, the range of the potential at the sixth node 18 is between "second power supply voltage V2"–"P-channel drain-source voltage VPds" and "N-channel drain-source voltage", which is smaller than the range in the conventional technique. As described above, the potential begins to decrease earlier and its change range is narrower as compared with the conventional level shifter. It is thus possible to operate the level shifter circuit 1 according to the present embodiment faster than the conventional level shifter circuit.

Figure 7:
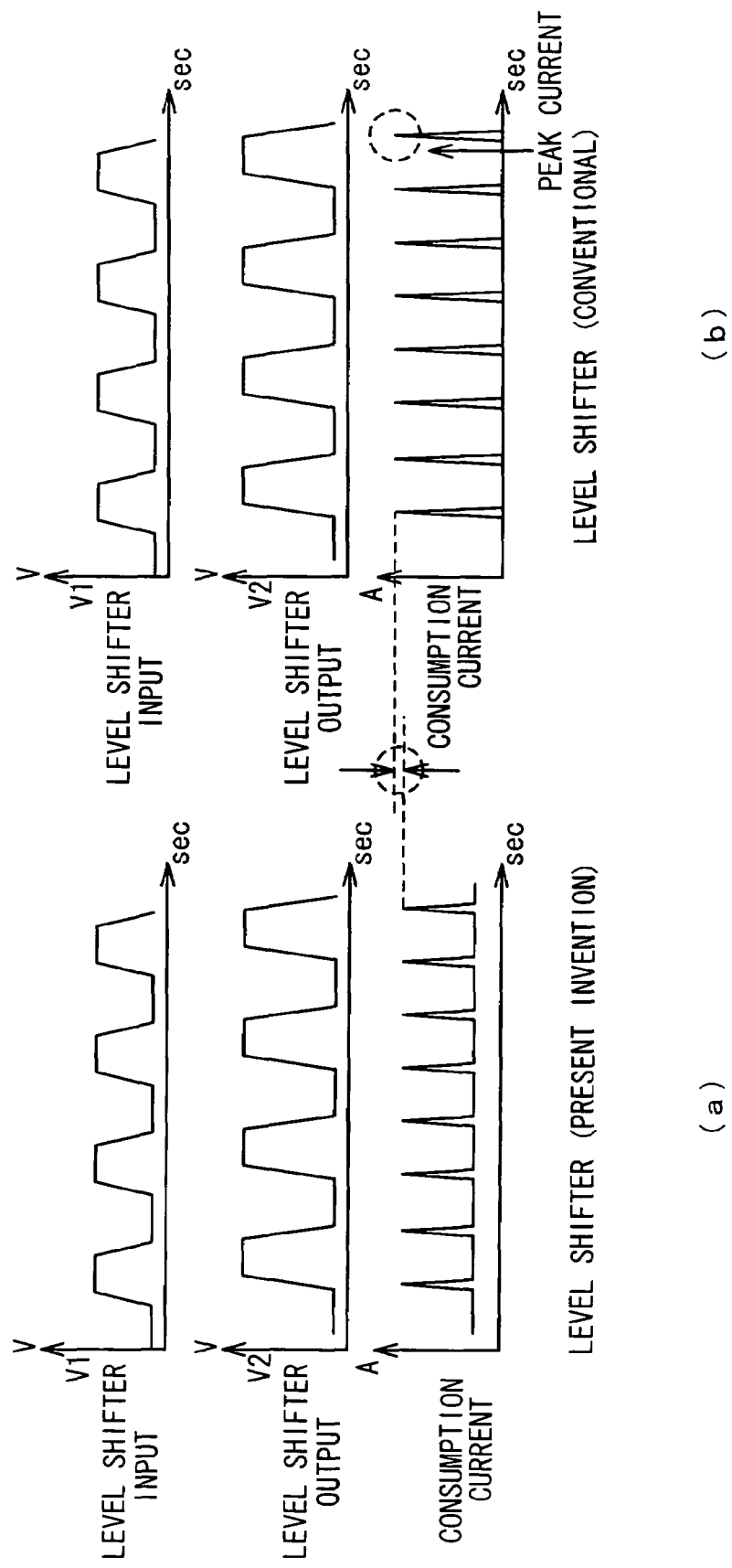
FIG. 7 is a waveform chart showing a value of a peak current in the level shifter circuit.

FIG. 7 is a waveform chart showing a peak value of current consumption during the operation of the level shifter circuit 1 in the present embodiment. The left side (a) shows the waveforms with regard to the level shifter circuit 1 according to the present embodiment, while the right side (b) shows the waveforms with regard to the conventional level shifter circuit. In the operation of the level shifter circuit, there exists a time when both the PMOS transistor and the NMOS transistor (such as a pair of the first PMOS transistor 6 and the first NMOS transistor 8, or a pair of the second PMOS transistor 7 and the second NMOS transistor 9) whose drains are connected to each other are in the ON state simultaneously. At this time, a current (peak current) momentarily flows from the second power supply line $V_{DD}2$ to the ground line $V_{SS}$ through the pair of the PMOS and NMOS transistors.

As shown in FIG. 7, according to the level shifter circuit 1 of the present embodiment, the peak current is smaller than that of the conventional technique, since the current drive capability of the PMOS transistor is smaller than the conventional technique. It is thus possible to suppress the potential variation of the power supply line and the ground line.

Figure 8:
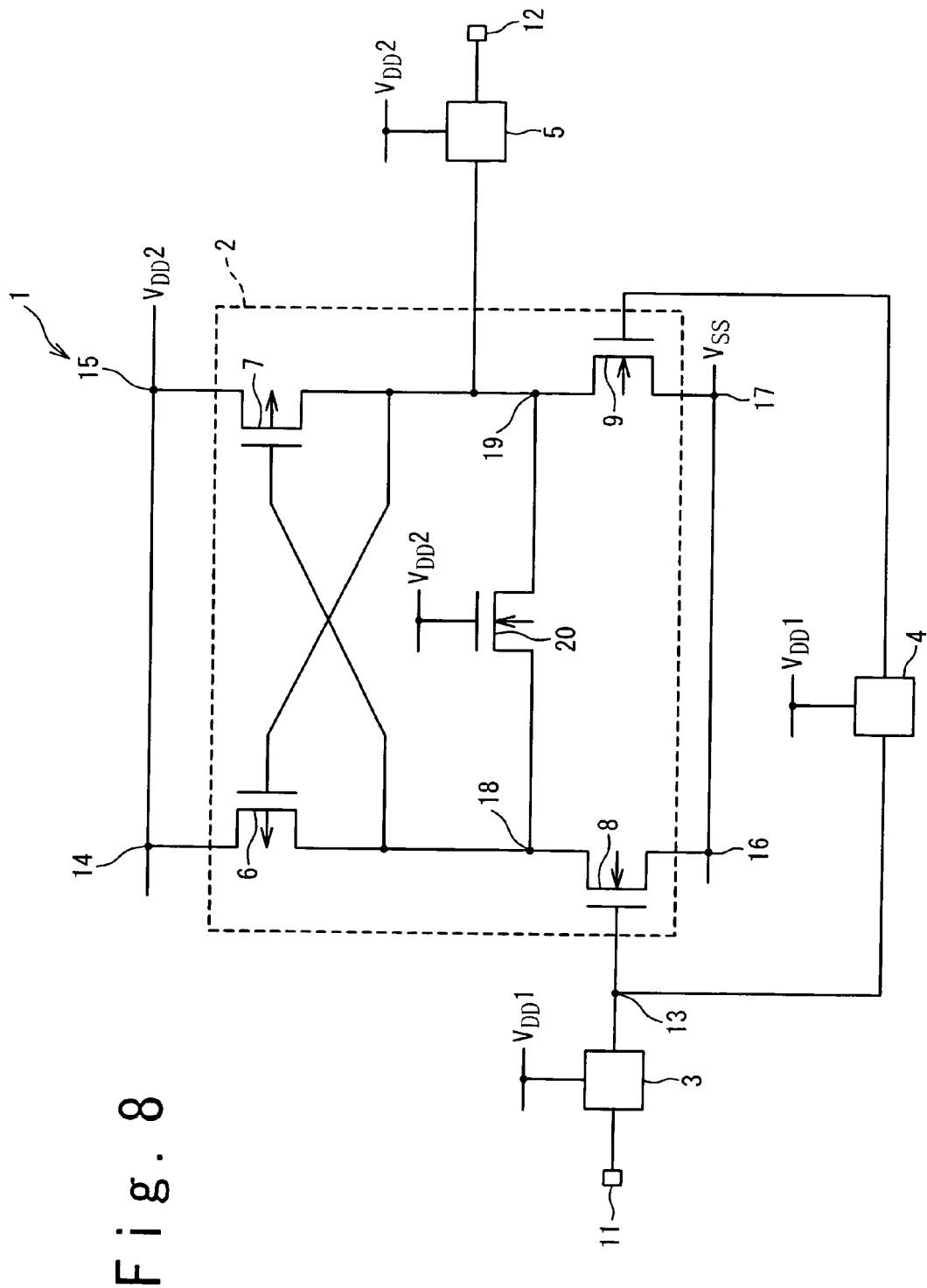
FIG. 8 is a circuit diagram showing another configuration of the level shifter circuit according to the first embodiment.

FIG. 8 is a circuit diagram showing another configuration of the level shifter circuit 1 according to the first embodiment of the present invention. Referring to FIG. 8, the level shifter part 2 of the level shifter circuit 1 has a resistance NMOS transistor 20 which is connected between the sixth node 18 and the seventh node 19. As described above, the level shifter circuit 1 of the present invention has the resistive element which generates the current path in accordance with the potential difference between the sixth node 18 and the seventh node 19. The level shifter circuit 1 shown in FIG. 8 is provided with the resistance NMOS transistor 20 as the resistive element. The second power supply voltage V2 is applied to the gate of the resistance NMOS transistor 20. As a result, the resistance NMOS transistor 20 operates similarly to the above-mentioned resistive element 10 of the level shifter circuit 1.

Hereinafter, referring to figures, other embodiments of the present invention will be described. In the following description of the embodiments, elements having the same reference numerals as those used in the former figures are assumed to have configuration and operation similar to those in the first embodiment. Therefore, the redundant description with respect to such elements will be omitted in the following embodiments.

Second Embodiment

Figure 9:
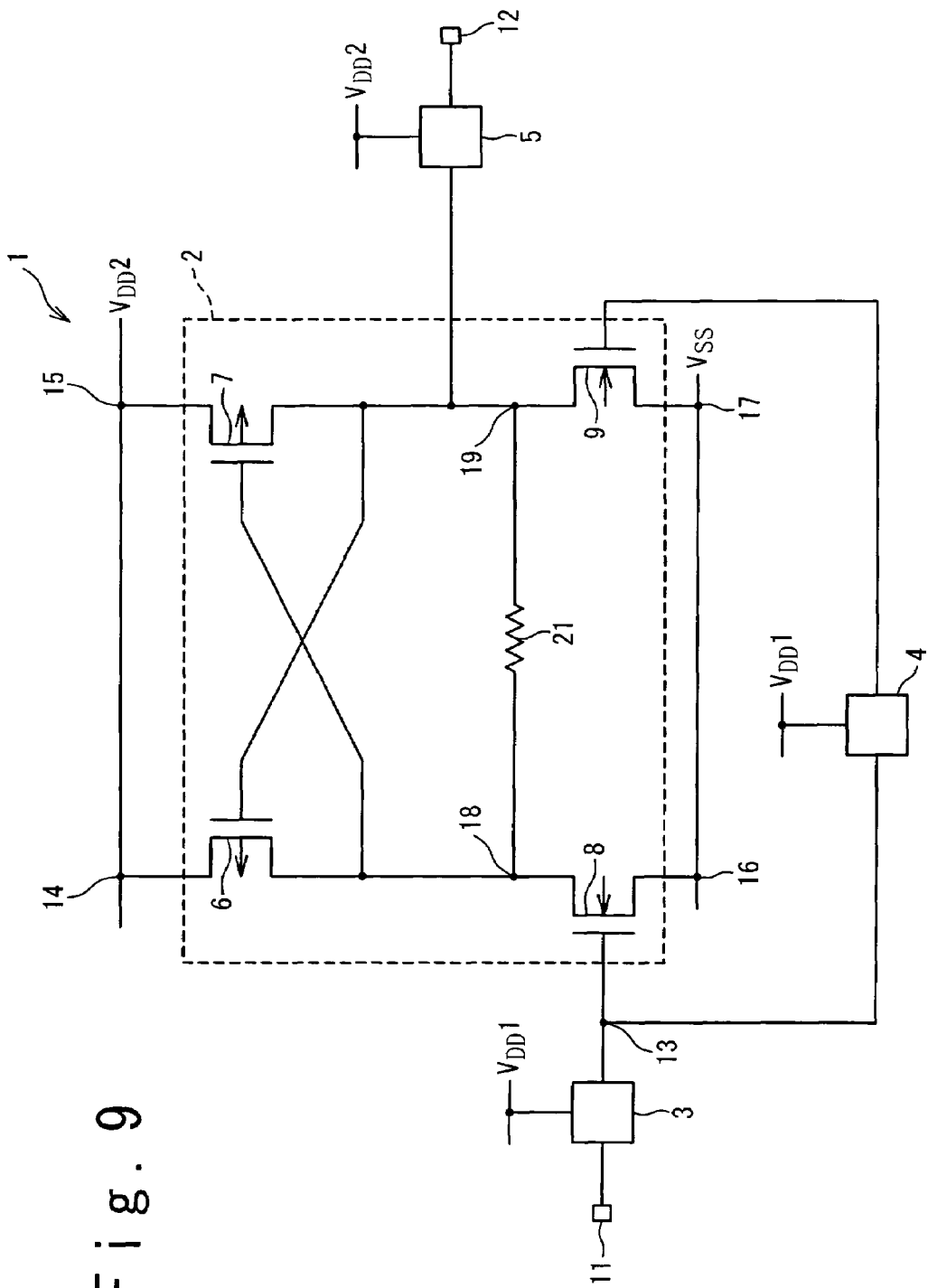
FIG. 9 is a circuit diagram showing a configuration of a level shifter circuit according to a second embodiment of the present invention.

FIG. 9 is a circuit diagram showing a configuration of a level shifter circuit 1 according to a second embodiment of the present invention. Referring to FIG. 9, the level shifter part 2 in the second embodiment has a passive resistive element 21 which is connected between the sixth node 18 and the seventh node 19. The level shifter circuit 1 in the above-mentioned first embodiment is provided with the MOS transistor between the sixth node 18 and the seventh node 19 as the resistive element. As shown in FIG. 9, the level shifter circuit 1 according to the second embodiment has the passive resistive element 21 as the resistive element. The passive resistive element 21 is a resistance element having the same resistance as the ON resistance of the foregoing resistive element 10 (or the resistance NMOS transistor 20). Such the passive resistive element 21 is connected between the sixth node 18 and the seventh node 19. As a result, the passive resistive element 21 operates similarly to the above-mentioned resistive element 10 or the resistance NMOS transistor 20 in the first embodiment.

Third Embodiment

Figure 10:
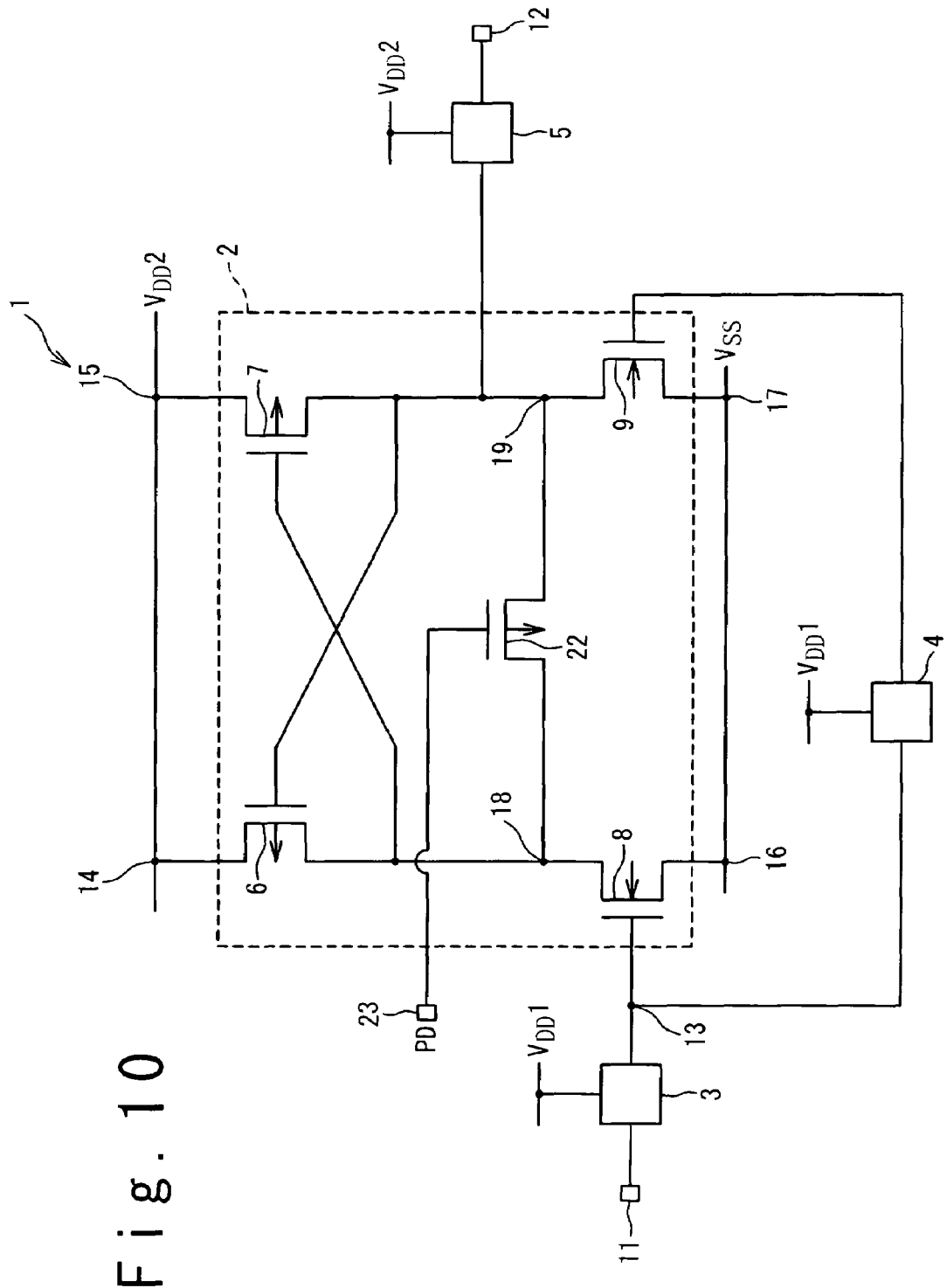
FIG. 10 is a circuit diagram showing a configuration of a level shifter circuit according to a third embodiment of the present invention.

FIG. 10 is a circuit diagram showing a configuration of a level shifter circuit 1 according to a third embodiment of the present invention. Referring to FIG. 10, the level shifter part 2 in the third embodiment has a resistance MOS transistor 22 which is connected between the sixth node 18 and the seventh node 19. As shown in FIG. 10, a gate of the resistance MOS transistor 22 is connected to a power down signal input terminal 23. Supplied to the level shifter part 2 through the power down signal input terminal 23 is a power down signal PD which can deactivate the resistance MOS transistor 22. That is, the resistance MOS transistor 22 can be set to an OFF state by the power down signal PD. The resistance MOS transistor 22 shown in FIG. 10 is a PMOS transistor. It is therefore possible to deactivate the resistance PMOS transistor 22 by applying the second power supply voltage V2 as the power down signal PD, for example. According to the configuration, as described above, the power down signal is supplied in addition to the signal for setting the resistance MOS transistor 22 to the ON state. It is thus possible to prevent the current from flowing from the second power supply line $V_{DD}2$ to the ground line $V_{SS}$ when the level shifter circuit 1 stops its operation.

The case where the resistance MOS transistor 22 is a PMOS transistor has been described above for example. The resistance MOS transistor 22 in the present embodiment is not limited to the case. The resistance MOS transistor 22 in the third embodiment can be an NMOS transistor.

Fourth Embodiment

Figure 11:
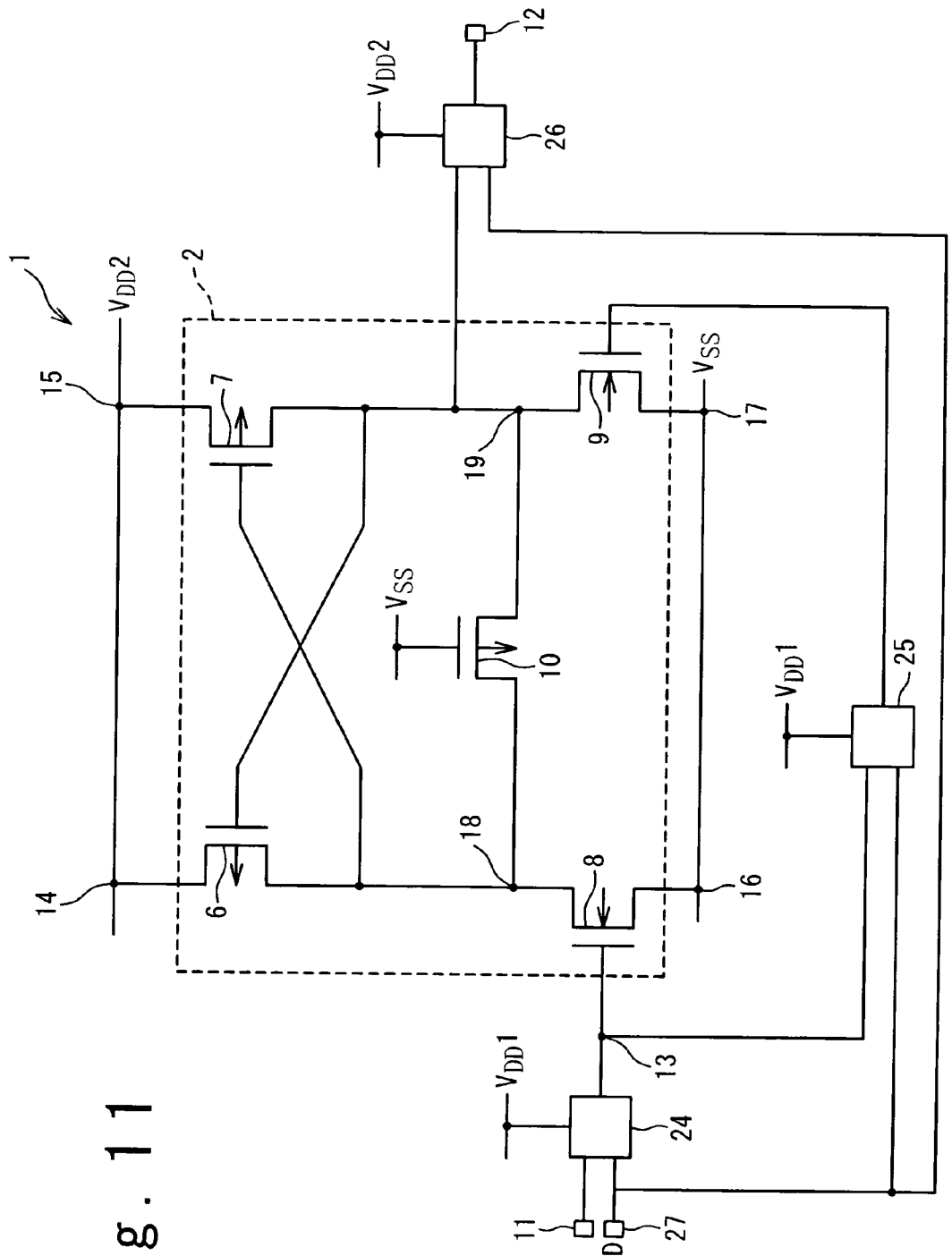
FIG. 11 is a circuit diagram showing a configuration of a level shifter circuit according to a fourth embodiment of the present invention.

FIG. 11 is a circuit diagram showing a configuration of a level shifter circuit 1 according to a fourth embodiment of the present invention. Referring to FIG. 11, the level shifter circuit 1 in the fourth embodiment has the level shifter part 2, a fourth logic circuit 24, a fifth logic circuit 25 and a second output logic circuit 26. The level shifter part 2 has the resistive element 10. Referring to FIG. 11, the level shifter circuit 1 in the fourth embodiment has a power down signal input terminal 27. Supplied through the power down signal input terminal 27 is a control signal (power down signal) PD different from the basic input signal.

The fourth logic circuit 24 and the fifth logic circuit 25 are logic circuits operating with the low voltage V1, respective of which can deactivate the first NMOS transistor 8 and the second NMOS transistor 9 in response to the control signal PD. That is, the first NMOS transistor 8 and the second NMOS transistor 9 are set to the OFF state by the control signal PD. The second output logic circuit 26 is a logic circuit operating with the high voltage V2, which can fix its output in accordance with the control signal PD. As shown in FIG. 11, the level shifter circuit 1 in the fourth embodiment can stop the steady current by turning off both the first NMOS transistor 8 and the second NMOS transistor 9. The second output logic circuit 26 has a power down function using the control signal PD. The second output logic circuit 26 can fix its operation when the first NMOS transistor 8 and the second NMOS transistor 9 are turned off and the input potential becomes an intermediate potential.

Figure 12:
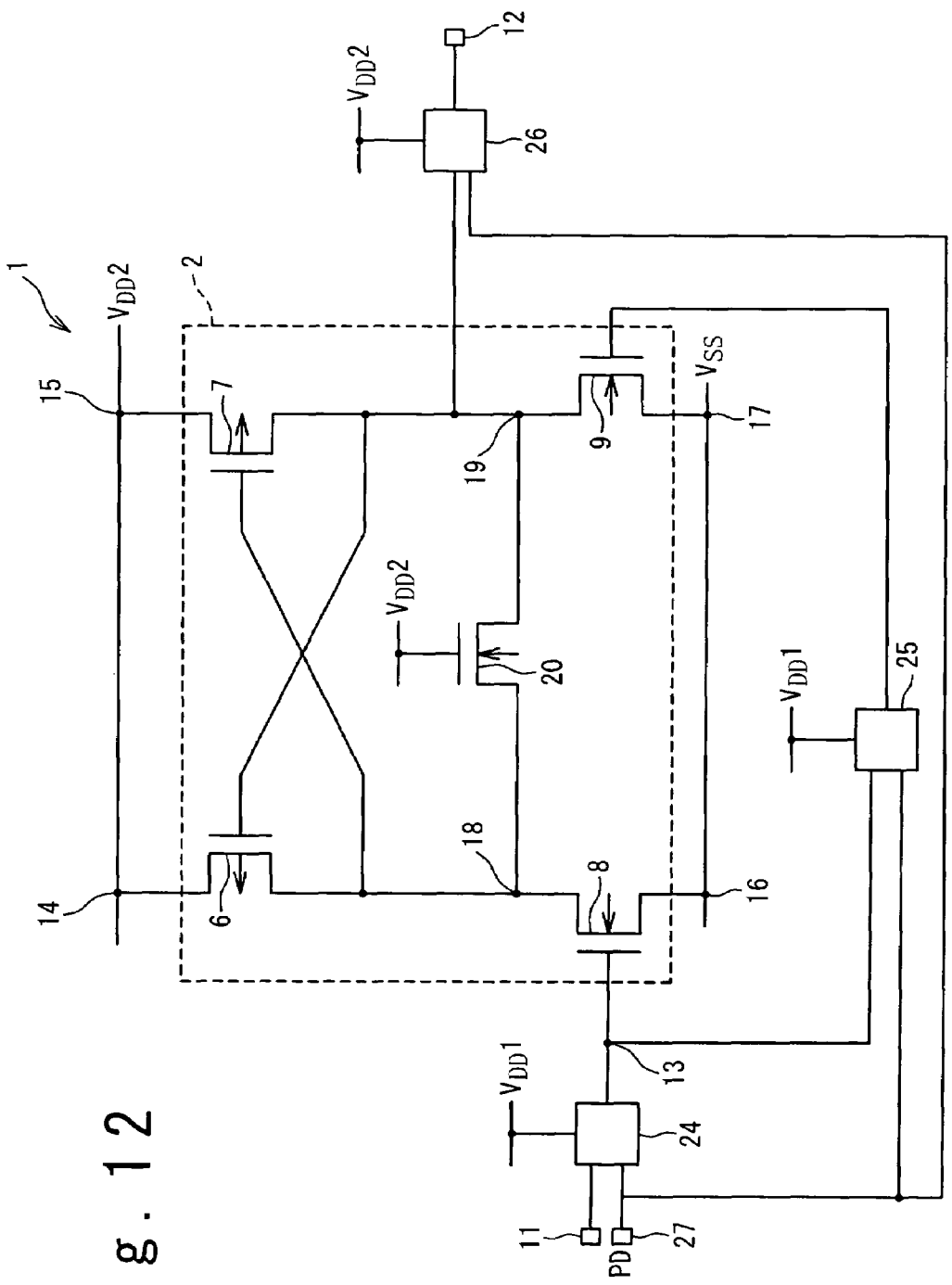
FIG. 12 is a circuit diagram showing another configuration of the level shifter circuit according to the fourth embodiment.

FIG. 12 is a circuit diagram showing another configuration of the level shifter circuit 1 according to the fourth embodiment. The level shifter circuit 1 shown in FIG. 12 has the level shifter part 2, and the level shifter part 2 includes the resistance NMOS transistor 20. As in the first embodiment, the level shifter circuit 1 in the present embodiment has a resistive element which forms the current path in response to the potential difference between the sixth node 18 and the seventh node 19. As shown in FIG. 12, the level shifter circuit 1 has the resistance NMOS transistor 20 as the resistive element. The second power supply voltage V2 is applied to the gate of the resistance NMOS transistor 20. As a result, the level shifter circuit 1 operates similarly to the above-mentioned level shifter circuit 1 having the resistive element 10.

Figure 13:
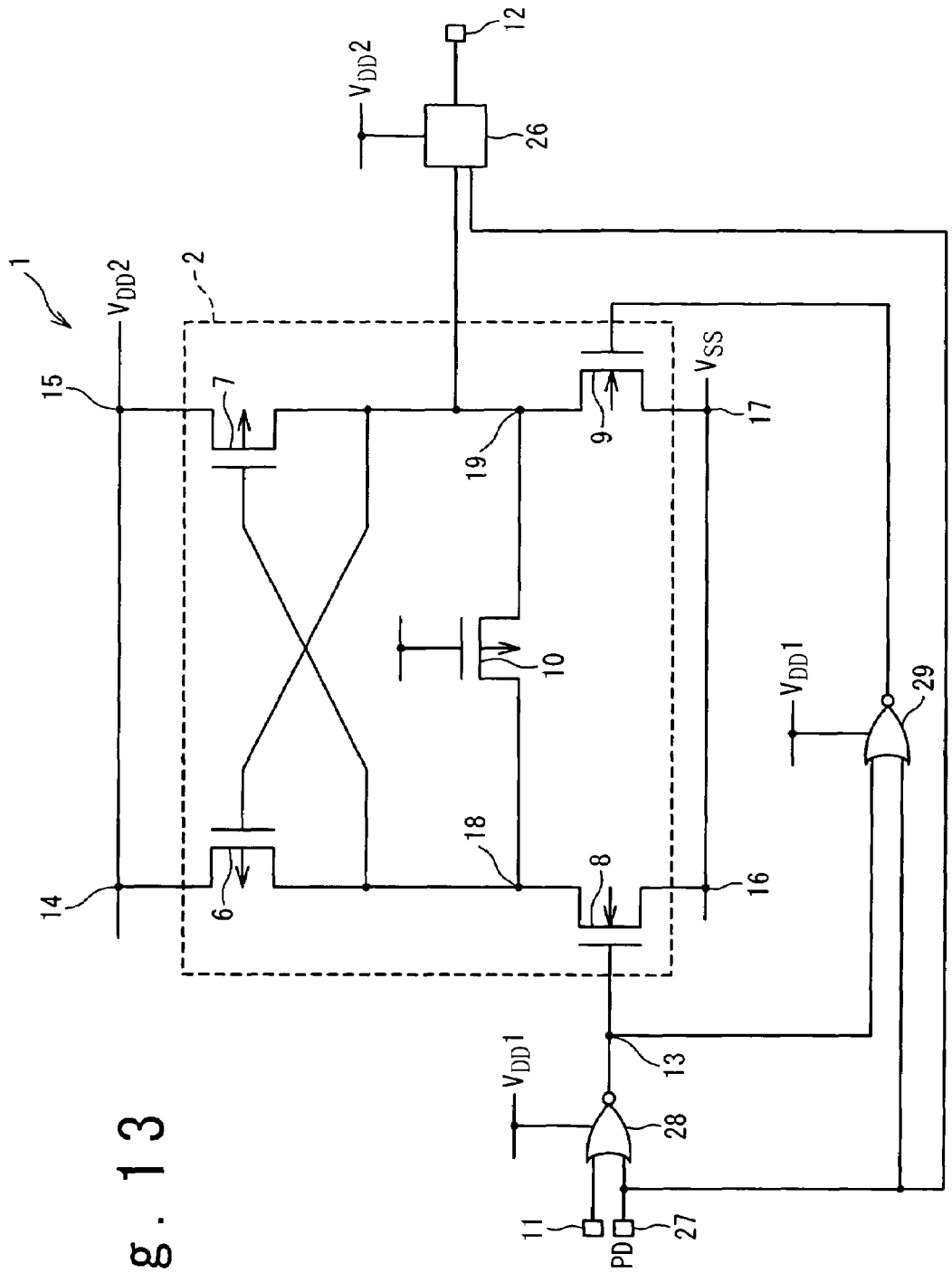
FIG. 13 is a circuit diagram showing a specific configuration according to the fourth embodiment.

In a case where each of the fourth logic circuit 24 and the fifth logic circuit 25 is a NOR circuit, for example, the configuration of the level shifter circuit 1 is as shown in FIG. 13. Referring to FIG. 13, the level shifter circuit 1 having the power down signal input terminal 27 is provided with a first NOR circuit 28 which receives a signal supplied through the input terminal 11 and a second NOR circuit 29 which receives a signal output from the first NOR circuit 28. The first NOR circuit 28 deactivates the first NMOS transistor 8 in response to the input signal supplied through the input terminal 11 and the control signal PD supplied through the power down signal input terminal 27. The second NOR circuit 29 deactivates the second NMOS transistor 9 in response to the signal output from the first NOR circuit 28 and the control signal PD.

Figure 14:
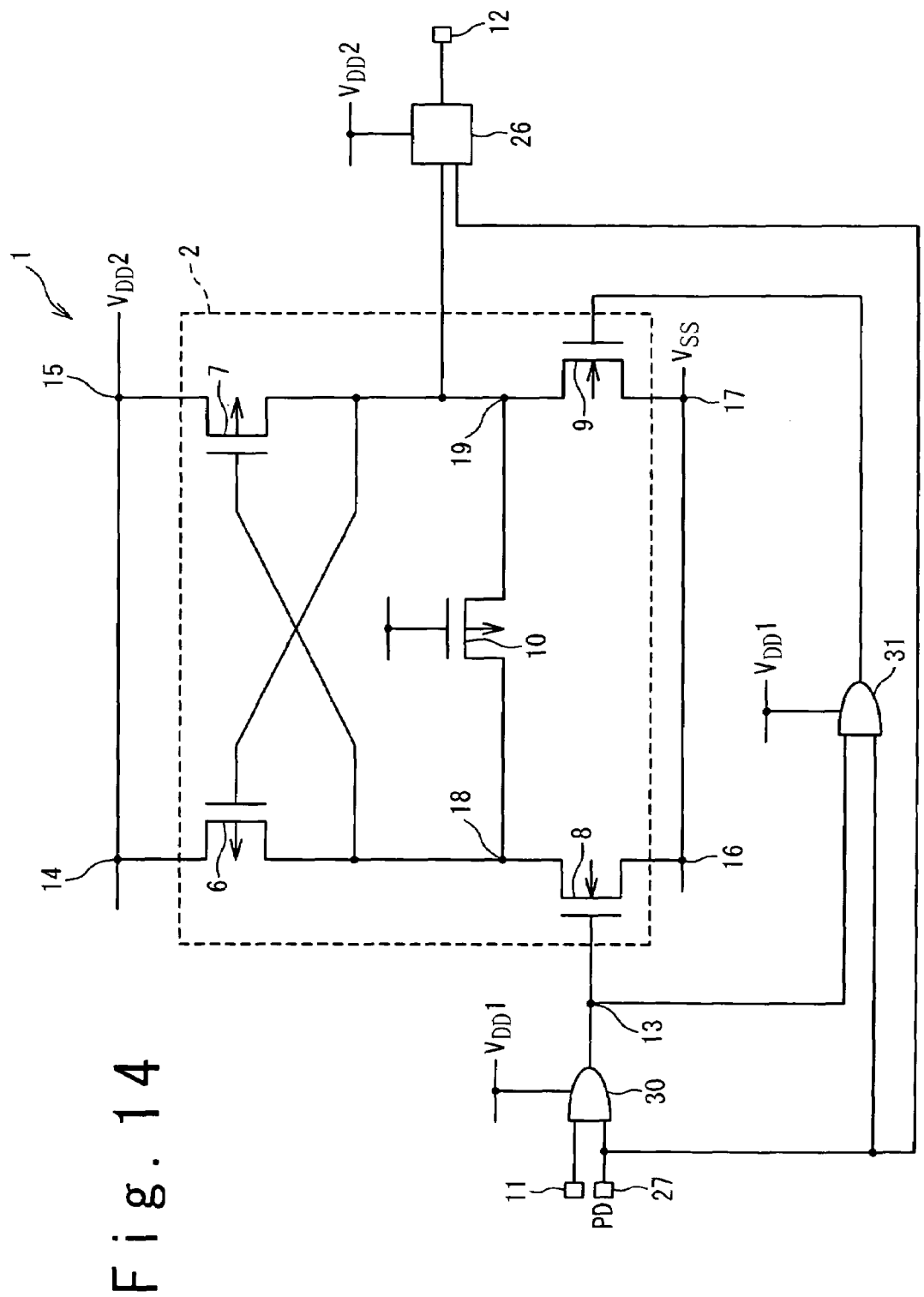
FIG. 14 is a circuit diagram showing another specific configuration according to the fourth embodiment.

In a case where each of the fourth logic circuit 24 and the fifth logic circuit 25 is an AND circuit, for example, the configuration of the level shifter circuit 1 is as shown in FIG. 14. Referring to FIG. 14, a first AND circuit 30 deactivates the first NMOS transistor 8 in response to the input signal supplied through the input terminal 11 and the control signal PD supplied through the power down signal input terminal 27. A second AND circuit 31 deactivates the second NMOS transistor 9 in response to the signal output from the first AND circuit 30 and the control signal PD. The level shifter circuit 1 configured as described above in the fourth embodiment is capable of stopping the steady current by turning off both the first NMOS transistor 8 and the second NMOS transistor 9.

Fifth Embodiment

Figure 15:
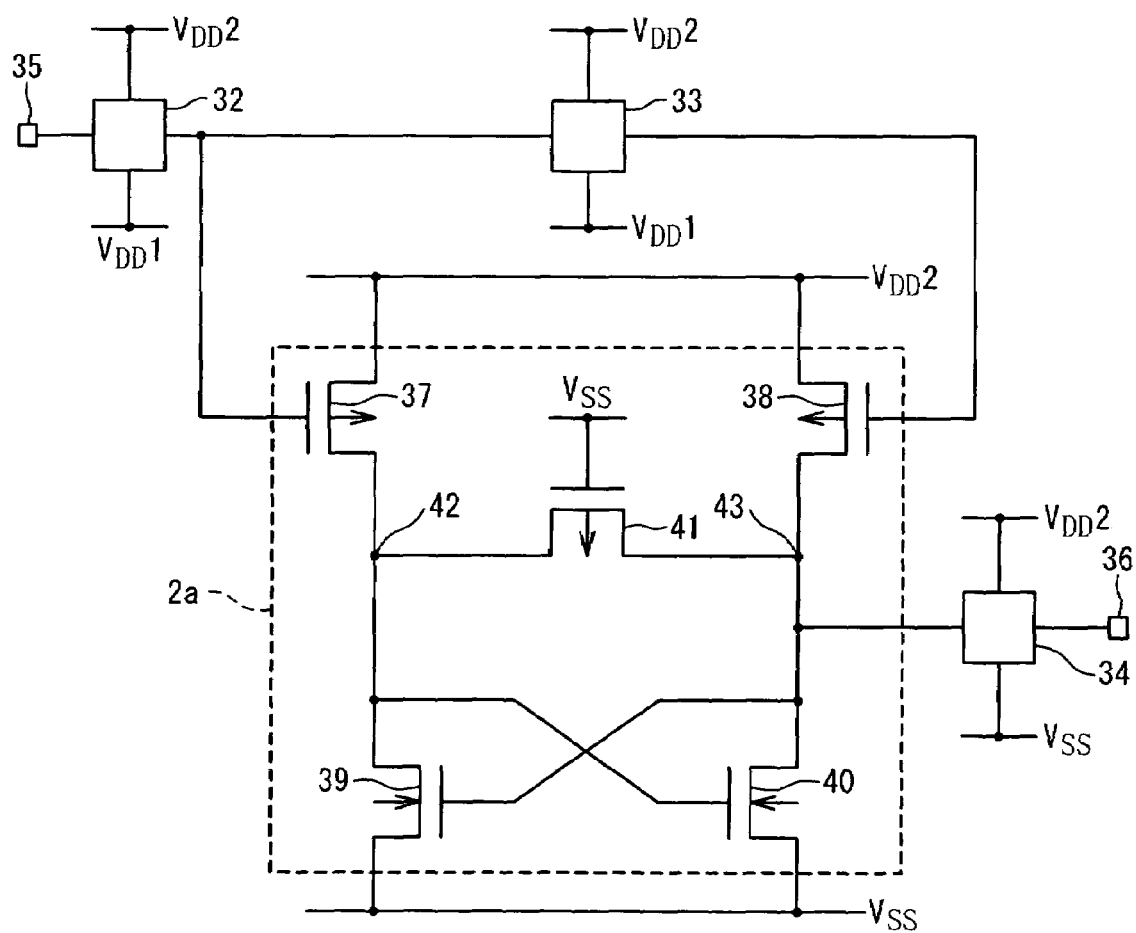
FIG. 15 is a circuit diagram showing a configuration of a level shifter circuit according to a fifth embodiment of the present invention.

FIG. 15 is a circuit diagram showing a configuration of a level shifter circuit 1 according to a fifth embodiment of the present invention. Referring to FIG. 5, the level shifter circuit 1 in the fifth embodiment has a level shifter part 2a, a sixth logic circuit 32, a seventh logic circuit 33 and a third output logic circuit 34. The sixth logic circuit 32 is a logic circuit which generates a first input signal in response to a signal supplied through an input terminal 35. The first input signal output from the sixth logic circuit 32 is supplied to a third PMOS transistor 37 of the level shifter part 2a. The first input signal is also input to the seventh logic circuit 33. The seventh logic circuit 33 is a logic circuit which generates a second input signal in response to the first input signal. The second input signal output from the seventh logic circuit 33 is input to a fourth PMOS transistor 38 of the level shifter part 2a. As shown in FIG. 15, the sixth logic circuit 32 and the seventh logic circuit 33 are connected to the second power supply line $V_{DD}2$ and the first power supply line $V_{DD}1$. The sixth logic circuit 32 generates the first input signal on the basis of the potential difference between the first power supply voltage V1 supplied from the first power supply line $V_{DD}1$ and the second power supply voltage V2 supplied from the second power supply line $V_{DD}2$. Similarly, the seventh logic circuit 33 generates the second input signal on the basis of the first power supply voltage V1 and the second power supply voltage V2. The third output logic circuit 34 outputs the output signal to an output terminal 36.

The level shifter part 2a includes the third PMOS transistor 37, the fourth PMOS transistor 38, a third NMOS transistor 39, a fourth NMOS transistor 40 and a resistance PMOS transistor 41. As shown in FIG. 15, sources of the third PMOS transistor 37 and the fourth PMOS transistor 38 are connected to the second power supply line $V_{DD}2$. The third NMOS transistor 39 is connected between a drain of the third PMOS transistor 37 and the ground line $V_{SS}$, and the fourth NMOS transistor 40 is connected between a drain of the fourth PMOS transistor 38 and the ground line $V_{SS}$. A gate of the fourth NMOS transistor 40 is connected to the drain of the third PMOS transistor 37 via a sixth node 42, and a gate of the third NMOS transistor 39 is connected to the drain of the fourth PMOS transistor 38 via a seventh node 43.

Referring to FIG. 15, the resistance PMOS transistor 41 is connected between the sixth node 42 and the seventh node 43. In the following description of the fifth embodiment referring to FIG. 15, a case where the resistance PMOS transistor 41 is a PMOS transistor is explained as an example. As shown in FIG. 15, a gate of the resistance PMOS transistor 41 in the present embodiment is connected to the ground line $V_{SS}$. During the operation of the level shifter circuit 1, the ground potential supplied from the ground line $V_{SS}$ is applied to the gate of the resistance PMOS transistor 41. Accordingly, while the level shifter circuit 1 performs a normal operation, the resistance PMOS transistor 41 is steadily activated and operates in the ON state.

When the basic input signal of High level is supplied to the input terminal 35 in FIG. 15, a current path consisting of the second power supply line $V_{DD}2$, the third PMOS transistor 37, the sixth node 42, the resistance PMOS transistor 41, the seventh node 43, the fourth NMOS transistor 40 and the ground line $V_{SS}$ is formed as in the first embodiment, since the resistance PMOS transistor 41 (the MOS transistor in the ON state) is disposed. When the basic input signal changes from High level to Low level, a current path consisting of the second power supply line $V_{DD}2$, the fourth PMOS transistor 38, the seventh node 43, the resistance PMOS transistor 41, the sixth node 42, the third NMOS transistor 39 and the ground line $V_{SS}$ is formed. Thus, as in the level shifter circuit 1 of the first embodiment, the level shifter circuit 1 according to the fifth embodiment is configured such that the potential at the sixth node 42 (or the seventh node 43) begins to change earlier as compared with the conventional level shifter circuit.

Figure 16:
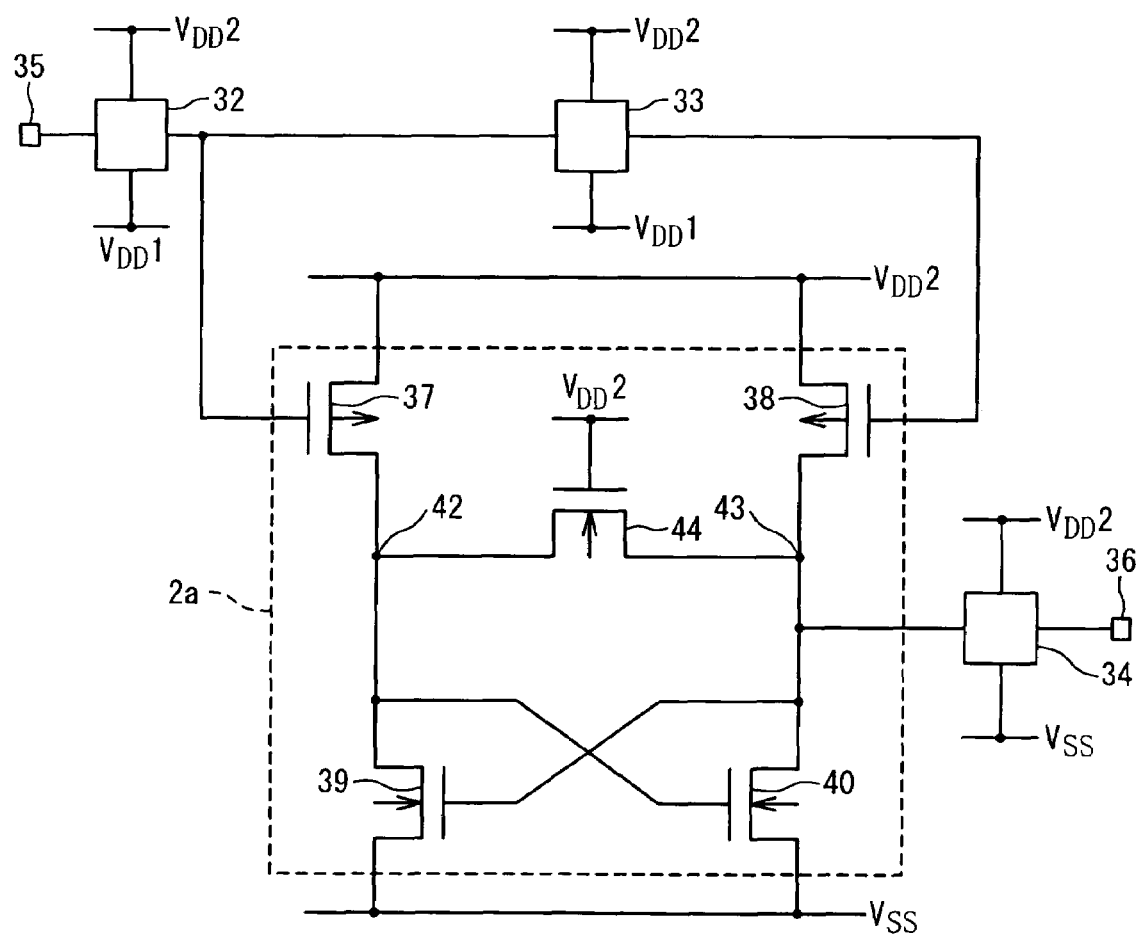
FIG. 16 is a circuit diagram showing another configuration of the level shifter circuit according to the fifth embodiment.

FIG. 16 is a circuit diagram showing another configuration of the level shifter circuit 1 according to the fifth embodiment. Referring to FIG. 16, the level shifter part 2a of the level shifter circuit 1 has a resistance NMOS transistor 44 which is connected between the sixth node 42 and the seventh node 43. The level shifter circuit 1 shown in FIG. 16 is provided with the resistance NMOS transistor 44 as the resistive element, and the second power supply voltage V2 is applied to a gate of the resistance NMOS transistor 44. Thus, the level shifter circuit 1 shown in FIG. 16 operates similar to the foregoing level shifter circuit 1 having the resistance PMOS transistor 41.

Sixth Embodiment

Figure 17:
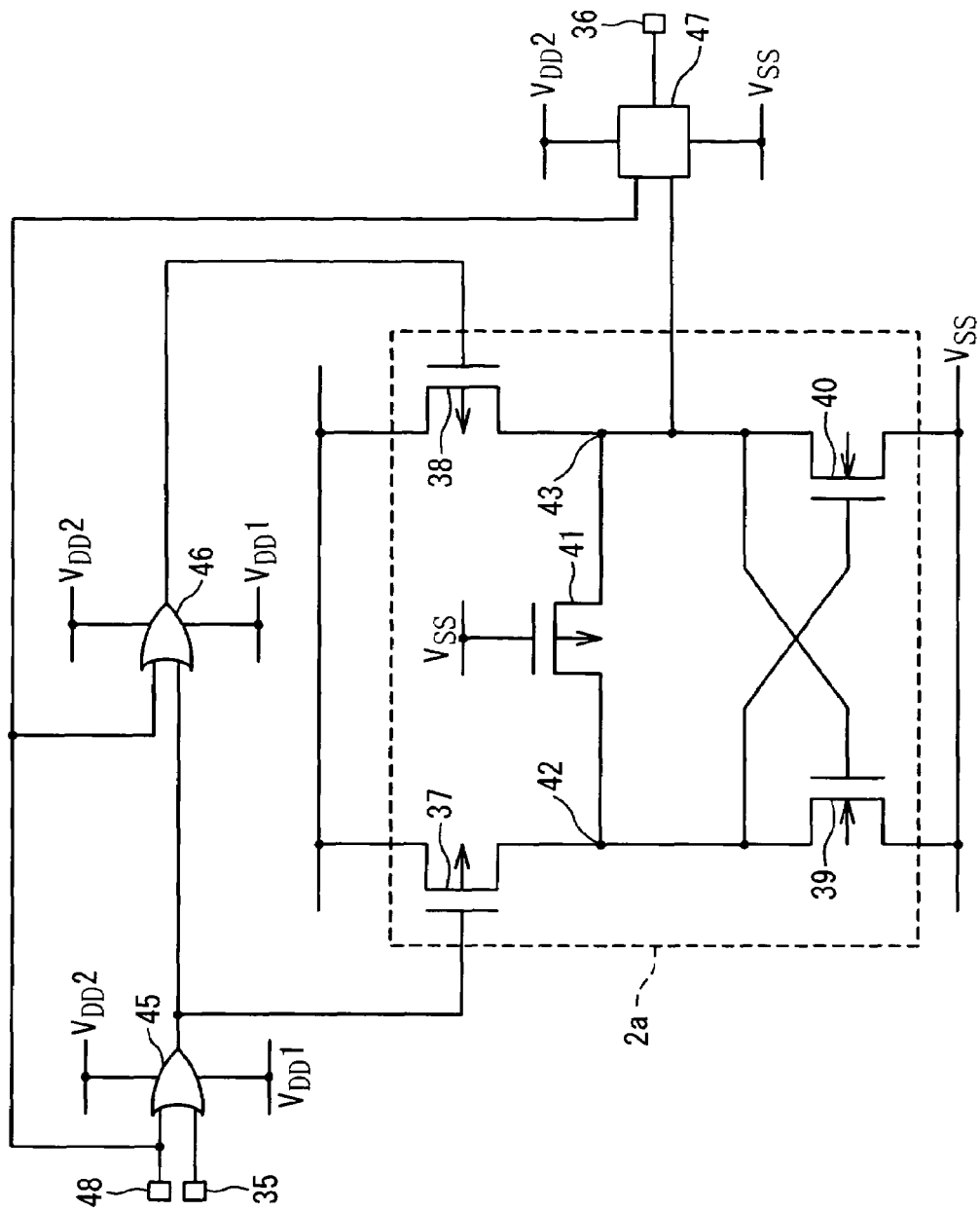
FIG. 17 is a circuit diagram showing a configuration of a level shifter circuit according to a sixth embodiment of the present invention.

FIG. 17 is a circuit diagram showing a configuration of a level shifter circuit 1 according to a sixth embodiment of the present invention. Referring to FIG. 17, the level shifter circuit 1 in the sixth embodiment includes the level shifter part 2a, a first OR circuit 45, a second OR circuit 46 and a fourth output logic circuit 47. The level shifter part 2a has the resistance PMOS transistor 41. Referring to FIG. 17, the level shifter circuit 1 in the sixth embodiment has a power down signal input terminal 48. Supplied through the power down signal input terminal 48 is the control signal PD which is different from the basic input signal.

The first OR circuit 45 and the second OR circuit 46 are logic circuits, respective of which can turn off the third PMOS transistor 37 and the fourth PMOS transistor 38 in accordance with the control signal PD. The fourth output logic circuit 47 is a logic circuit operating with the high voltage, which is capable of fixing its output in accordance with the control signal PD.

Referring to FIG. 17, the first OR circuit 45 and the second OR circuit 46 are configured in a similar connection configuration. As shown in FIG. 17, the level shifter circuit 1 in the sixth embodiment can stop the steady current by turning off both the third PMOS transistor 37 and the fourth PMOS transistor 38. The fourth output logic circuit 47 has a power down function using the control signal PD. The fourth output logic circuit 47 can fix its operation when the third PMOS transistor 37 and the fourth PMOS transistor 38 are turned off and the input potential becomes an intermediate potential.

Figure 18:
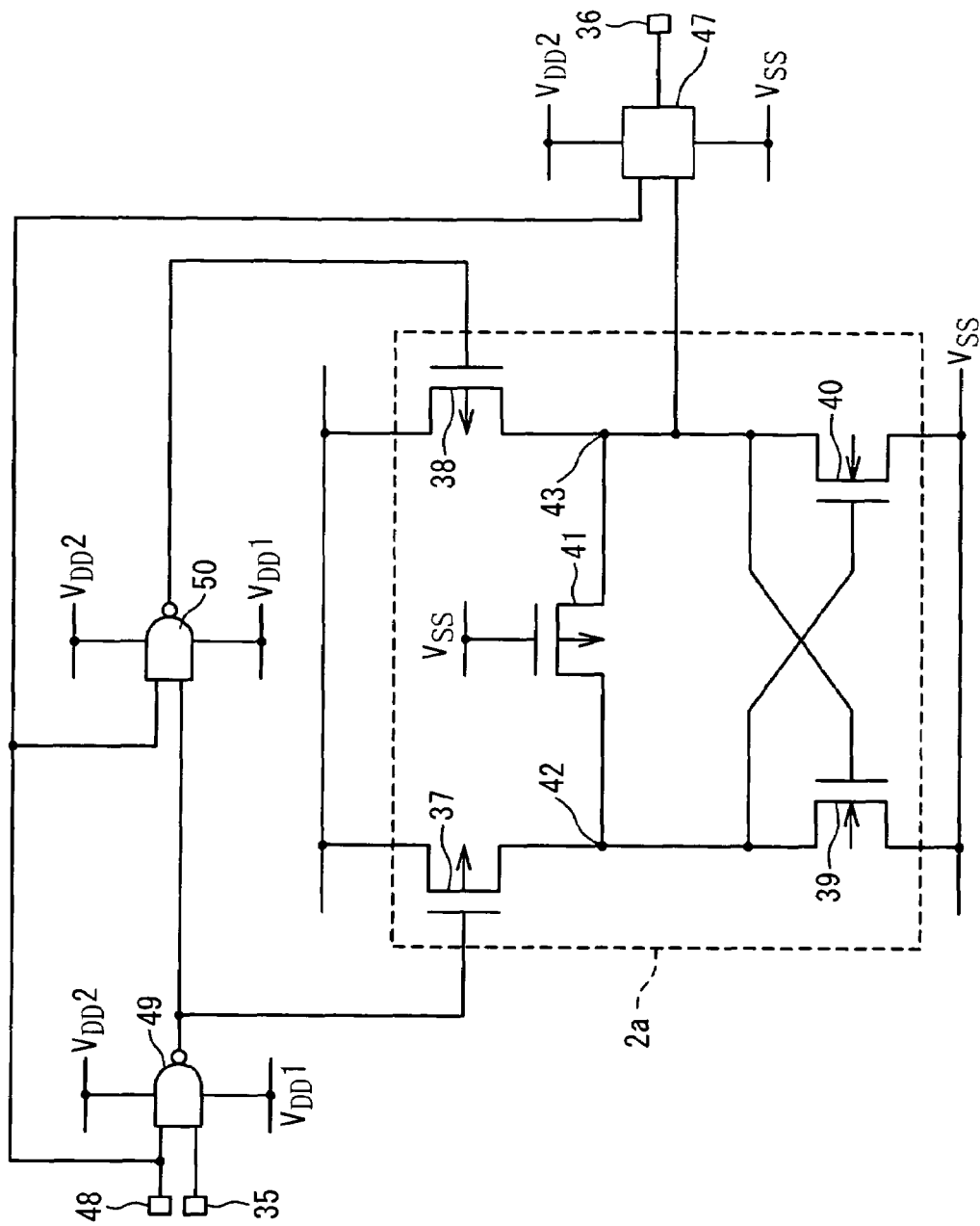
FIG. 18 is a circuit diagram showing another configuration of the level shifter circuit according to the sixth embodiment.

FIG. 18 is a circuit diagram showing another configuration of the level shifter circuit 1 according to the sixth embodiment. Referring to FIG. 18, the level shifter circuit 1 includes a first NAND circuit 49 and a second NAND circuit 50. The first NAND circuit 49 deactivates the third PMOS transistor 37 in response to the input signal supplied through the input terminal 35 and the control signal PD supplied through the power down signal input terminal 48. The second NAND circuit 50 deactivates the fourth PMOS transistor 38 in response to a signal output from the first NAND circuit 49 and the control signal PD. The level shifter circuit 1 configured as described above in the sixth embodiment is capable of stopping the steady current by turning off both the third PMOS transistor 37 and the fourth PMOS transistor 38.

The above-mentioned plurality of embodiments can be performed in combination unless a contradiction occurs in the configurations and the operations thereof. It is apparent that the present invention is not limited to the above embodiment, and that may be modified and changed without departing from the scope and spirit of the invention.

What is claimed is:

1. A level shifter circuit comprising:
    a first transistor configured to be activated in response to a logic signal whose high level voltage is a first voltage to be shifted;
    a second transistor configured to be activated in response to an inverse logic signal whose logic is opposite to that of said logic signal;
    a third transistor connected to a drain of said first transistor through a first node;
    a fourth transistor connected to a drain of said second transistor through a second node;
    a resistive element connected between said first node and said second node; and
    a power down terminal to which a power down signal is supplied,
    wherein said first transistor is connected between a power supply line and a ground line by way of said third transistor, said power supply line supplying a second voltage different from said first voltage,
    said second transistor is connected between said power supply line and said ground line by way of said fourth transistor,
    a gate of said third transistor is connected to said drain of said second transistor through said second node, a gate of said fourth transistor is connected to said drain of said first transistor through said first node, and
the resistive element is deactivated in response to said power down signal applied.

2. The level shifter circuit according to claim 1, wherein
said first transistor and said second transistor comprise N-channel MOS transistors,
said third transistor and said fourth transistor comprise P-channel MOS transistors,
said third transistor is connected between said power supply line and said first node, and
said fourth transistor is connected between said power supply line and said second node.

3. The level shifter circuit according to claim 1, wherein
said first transistor and said second transistor comprise P-channel MOS transistors,
said third transistor and said fourth transistor comprise N-channel MOS transistors,
said third transistor is connected between said first node and said ground line, and
said fourth transistor is connected between said second node and said round line.

4. The level shifter circuit according to claim 1, further comprising:
a first logic circuit configured to generate said logic signal;
a second logic circuit connected to said first logic circuit and configured to generate said inverse logic signal in response to said logic signal; and
a third logic circuit configured to generate an output signal based on said second voltage, in response to a signal supplied from any of said first node and said second node.

5. The level shifter circuit according to claim 4, wherein said first logic circuit and said second logic circuit comprise low voltage inverters, and said third logic circuit comprises a high voltage inverter.

6. The level shifter circuit according to claim 4, wherein said first logic circuit and said second logic circuit comprise NOR circuits.

7. The level shifter circuit according to claim 4, wherein said first logic circuit and said second logic circuit comprise NAND circuits.

8. The level shifter circuit according to claim 4, wherein said first logic circuit and said second logic circuit comprise OR circuits.

9. The level shifter circuit according to claim 4, wherein said first logic circuit and said second logic circuit comprise AND circuits.

10. The level shifter circuit according to claim 1, further comprising:
a first logic circuit configured to generate said logic signal;
a second logic circuit connected to said first logic circuit and configured to generate said inverse logic signal in response to said logic signal; and
a third logic circuit associated with any of said first node and said second node to provide said second voltage in response to an output from any of said first node and said second node.

11. A level shifter circuit comprising:
a first transistor configured to be activated in response to a logic signal whose high level voltage is a first voltage to be shifted;
a second transistor configured to be activated in response to an inverse logic signal whose logic is opposite to that of said logic signal;
a third transistor connected to a drain of said first transistor through a first node;

a fourth transistor connected to a drain of said second transistor through a second node; and
a resistive element connected between said first node and said second node,
wherein said first transistor is connected between a power supply line and a around line by way of said third transistor, said power supply line supplying a second voltage different from said first voltage,
said second transistor is connected between said power supply line and said around line by way of said fourth transistor,
a gate of said third transistor is connected to said drain of said second transistor through said second node, and
a gate of said fourth transistor is connected to said drain of said first transistor through said first node,
wherein said resistive element comprises a MOS transistors and said MOS transistor electrically connects between said first node and said second node in accordance with a signal voltage applied to a gate of said MOS transistor.

12. The level shifter circuit according to claim 11, further comprising a power down terminal to which a power down signal is supplied,
wherein said MOS transistor is deactivated in response to said power down signal applied to said gate of said MOS transistor.

13. The level shifter circuit according to claim 11, wherein said MOS transistor comprises a P-channel MOS transistor.

14. The level shifter circuit according to claim 13, wherein
said first transistor and said second transistor comprise N-channel MOS transistors,
said third transistor and said fourth transistor comprise P-channel MOS transistors,
said third transistor is connected between said power supply line and said first node, and
said fourth transistor is connected between said power supply line and said second node.

15. The level shifter circuit according to claim 13, wherein
said first transistor and said second transistor comprise P-channel MOS transistors,
said third transistor and said fourth transistor comprise N-channel MOS transistors,
said third transistor is connected between said first node and said ground line, and
said fourth transistor is connected between said second node and said ground line.

16. The level shifter circuit according to claim 11, wherein said MOS transistor comprises an N-channel MOS transistor.

17. The level shifter circuit according to claim 16, wherein
said first transistor and said second transistor comprise N-channel MOS transistors,
said third transistor and said fourth transistor comprise P-channel MOS transistors,
said third transistor is connected between said power supply line and said first node, and
said fourth transistor is connected between said power supply line and said second node.

18. The level shifter circuit according to claim 16, wherein
said first transistor and said second transistor comprise P-channel MOS transistors,
said third transistor and said fourth transistor comprise N-channel MOS transistors,
said third transistor is connected between said first node and said ground line, and
said fourth transistor is connected between said second node and said ground line.

* * * * *